United States Patent [19]

Yerman

[11] Patent Number: 4,538,170

[45] Date of Patent: Aug. 27, 1985

[54] POWER CHIP PACKAGE

[75] Inventor: Alexander J. Yerman, Scotia, N.Y.

[73] Assignee: General Electric Company, Schenectady, N.Y.

[21] Appl. No.: 455,186

[22] Filed: Jan. 3, 1983

[51] Int. Cl.³ .................... H01L 23/08; H01L 23/04; H01L 23/48; H01L 23/12

[52] U.S. Cl. .................... 357/80; 357/81; 357/68; 357/74; 174/16 HS

[58] Field of Search ............ 357/80, 81, 74, 68; 174/16 HS

[56] References Cited

U.S. PATENT DOCUMENTS

| | | | |
|---|---|---|---|
| Re. 29,325 | 7/1977 | Hargis | 357/81 |
| 3,025,436 | 3/1962 | Staller | 357/81 |
| 3,196,325 | 7/1965 | Swartz | 357/68 |
| 3,377,206 | 4/1968 | Hänlein et al. | 357/68 |
| 3,566,212 | 2/1971 | Marx | 357/80 |
| 3,611,059 | 10/1971 | Carley | 357/74 |
| 3,649,881 | 3/1972 | Chang et al. | 357/81 |
| 3,766,634 | 10/1973 | Babcock et al. | 29/471.9 |
| 3,842,189 | 10/1974 | Southgate | 357/68 |
| 3,994,430 | 11/1976 | Cusano et al. | 228/122 |
| 4,067,041 | 1/1978 | Hutson | 357/80 |

OTHER PUBLICATIONS

"Technology Update", *EDN* Magazine (May 27, 1981), pp. 49–56, 58, 66–68, 70, 72 and 74.
"The General Electric Hi-Line TM Power Module Concept" by D. R. Grafham and E. I. Carroll of the General Electric Co., Application Engineering-Paris International General Electric Brochure 80.02 (9/80).

*Primary Examiner*—Martin H. Edlow
*Assistant Examiner*—Jerome Jackson
*Attorney, Agent, or Firm*—Marvin Snyder; James C. Davis, Jr.

[57] ABSTRACT

A heat-generating power semiconductor chip is mounted in a package to permit testing or use of the chip before or after mounting of the package to a heat spreader plate. A plurality of sheet metal leads are attached to a dielectric substrate, such as beryllia. The leads are patterned in mirror image fashion to a plurality of terminals on one side of the power chip. In one form, a further sheet metal lead is attached to a further dielectric substrate and is adapted to abut a terminal on the other side of the power chip. In another form, heat transfer structure is provided for transferring heat between the pair of dielectric substrates, thereby enabling heat to be removed from both sides of the power chip.

15 Claims, 6 Drawing Figures

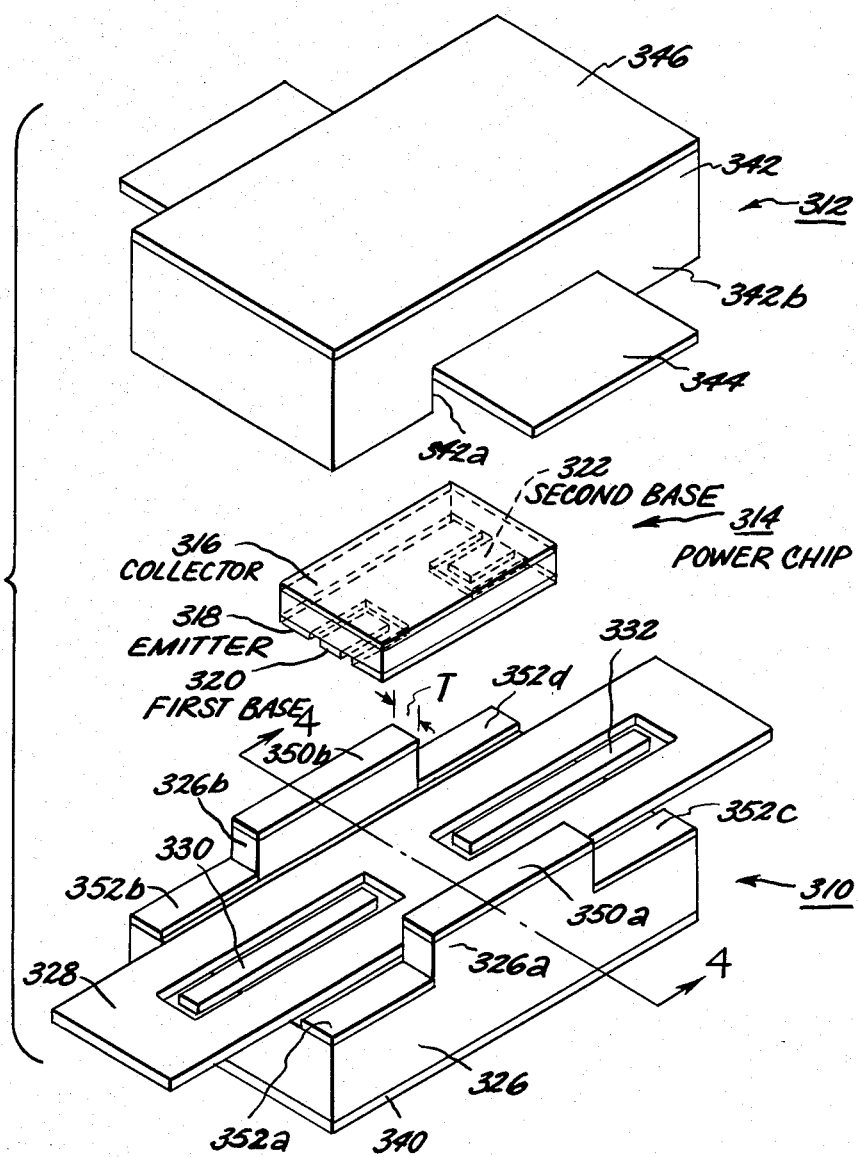
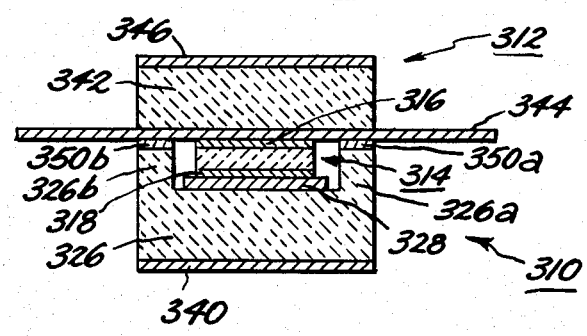

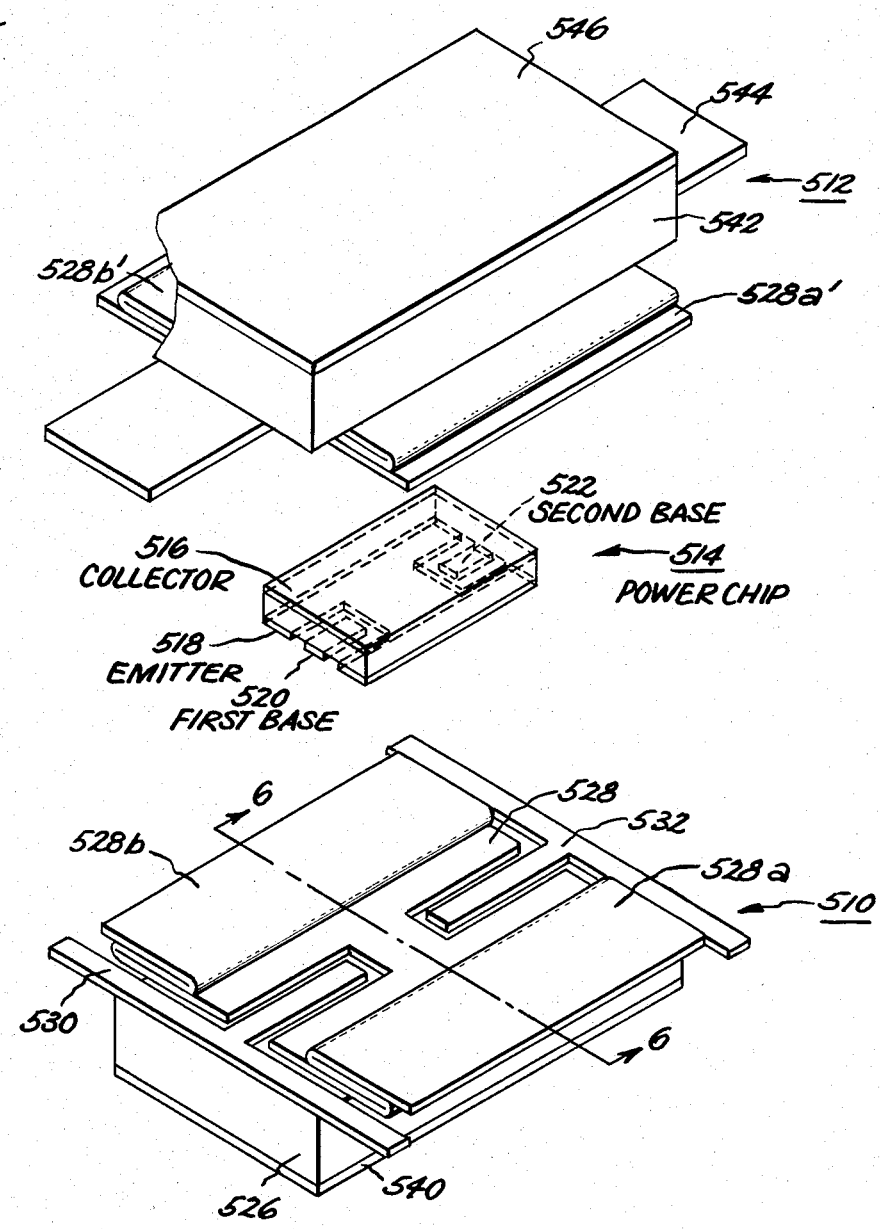
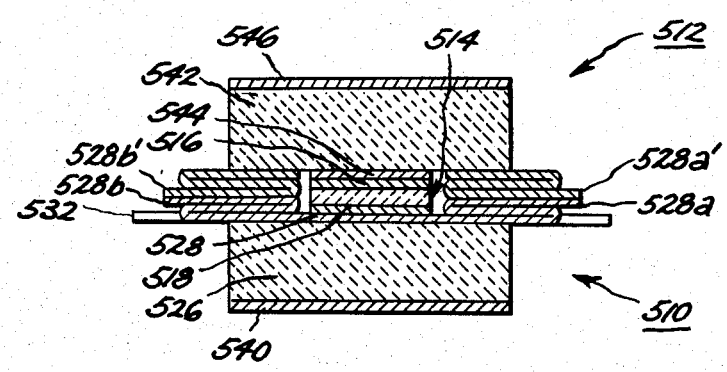

POWER CHIP PACKAGE

BACKGROUND AND SUMMARY OF THE INVENTION

My invention relates to packages for semiconductor chips, and more particularly to packages incorporating high thermal conductivity elements for drawing heat away from a power semiconductor chip.

Semiconductor chips that generate heat during operation in excess of about one watt are known in the art as "power" chips as distinct from "signal" chips, where power dissipation is usually much lower. Such heat arises primarily from $I^2R$ conduction or switching losses in the chip. To avoid thermal damage, the heat must be removed from a power chip and transferred to, for example, a metallic heat spreader plate or heat sink. However, power chips must be electrically tested at rated current in order to determine significant characteristics, such as, in a bipolar transistor, the common emitter current gain, $H_{FE}$, and the collector-to-emitter voltage at device saturation, $V_{CE\,(SAT)}$. These characteristics typically vary considerably from chip to chip, even though the chips are made in the same batch. Such electrical testing requires the chip to be operated at high levels of heat generation, requiring the chip to be mounted in a package incorporating high thermal conductivity elements for removing heat from the power chip.

A typical power chip package that is commercially available includes a high thermal conductivity dielectric substrate, such as alumina, with a single layer of solderable metal on its upper surface covering a large area of the substrate. The substrate is mounted on a metallic heat spreader plate to facilitate heat removal. That side of a power chip having only one large area electric terminal, for example, a collector terminal of a typical bipolar transistor, is positioned to face downward and is soldered to the solderable layer atop the dielectric substrate. One or more wires are then bonded to the one or more terminals on the reverse or upper side of the power chip and are connected to electrically isolated areas of the power chip that are suitable for interconnection to external circuitry.

The presence of the bonded wire(s) on the upper side of the chip undesirably precludes a high thermal conductivity element from being attached to such upper side. Additionally, the wires bonded to the upper side of the chip are too fragile to be directly connected to testing circuitry, and therefore such wires must be first attached to rugged lead structure which, in turn, can be directly connected to testing circuitry. For high current power chips, such rugged lead structure is so large that it cannot be supported solely by the dielectric substrate on which the power chip is mounted, but must have additional mechanical support from the metallic heat spreader plate onto which the dielectric substrate is also mounted. The individual leads of the rugged lead structure must be provided with appropriate electrical insulation, so that a complete (and costly) package must be assembled before chip testing is possible. The use of such power chip packages for chip testing in order to select a group of chips with similar characteristics is especially costly, since chips with undesired characteristics along with their packages are likely to be discarded.

An object of this invention is to provide a power chip package which is simple in construction and thus of reduced cost than presently-available power chip packages.

A further object of the invention is to provide a power chip package capable of removing significantly more heat from a power chip than presently-available power chip packages.

In accordance with a preferred embodiment of my invention, I provide a power chip package comprising a dielectric substrate, preferably of beryllia, and a plurality of sheet metal leads, preferably of copper, attached to a first side of the dielectric substrate, preferably by means of a eutectic bonding technique. The sheet metal leads are patterned in mirror image fashion to a plurality of terminals on one side of a power chip, for example, a power Darlington transistor. After the power chip is mounted on the sheet metal leads, as by soldering, heat generated in the power chip is drawn into the dielectric substrate via the sheet metal leads, and can be transferred to a heat sink by mounting the substrate thereon. The other side of the power chip, at least where it has one terminal, can be readily connected to external circuitry for testing simply by pressing a large area conductor against the exposed terminal.

In accordance with a more preferred embodiment of my invention, I include, in addition to the power chip package thus far described, a second dielectric substrate having a sheet metal lead attached thereto. This lead is adapted to be connected to a single, large area terminal of the power chip. This power chip package provides even more heat removal capacity than presently-available power chip packages, since the second dielectric substrate absorbs heat from the power chip.

In accordance with a still more preferred embodiment of my invention, I include, in addition to the foregoing power chip package, heat transfer means for transferring heat from the second dielectric substrate to the first one. The heat transfer means may comprise, for example, projections of one dielectric substrate which abut the other substrate when the package is assembled. This power chip package is capable of removing significantly more heat from a power chip than presently-available power chip packages, because heat removed from both sides of the power chip by the pair of substrates can be transferred to a heat sink.

BRIEF DESCRIPTION OF THE DRAWINGS

While this specification concludes with claims particularly pointing out and distinctly claiming the subject matter which I regard as my invention, it is believed that the invention, along with further objects and advantages thereof, will be better understood from the following description, when considered with the following figures of the drawings, in which like parts have like reference numerals:

FIG. 3 is a view similar to FIG. 1 illustrating a power chip package in accordance with a further embodiment of my invention.

FIG. 4 is a cross-sectional view of the power chip package of FIG. 3 when assembled, taken along line 4—4 in FIG. 3;

FIG. 5 is a view also similar to FIG. 1, illustrating a power chip package in accordance with another embodiment of my invention; and FIG. 6 is a cross-sectional view of the power chip package of FIG. 5 when assembled, taken along line 6—6 in FIG. 5.

DESCRIPTION OF THE PREFERRED EMBODIMENTS

Figure 1:
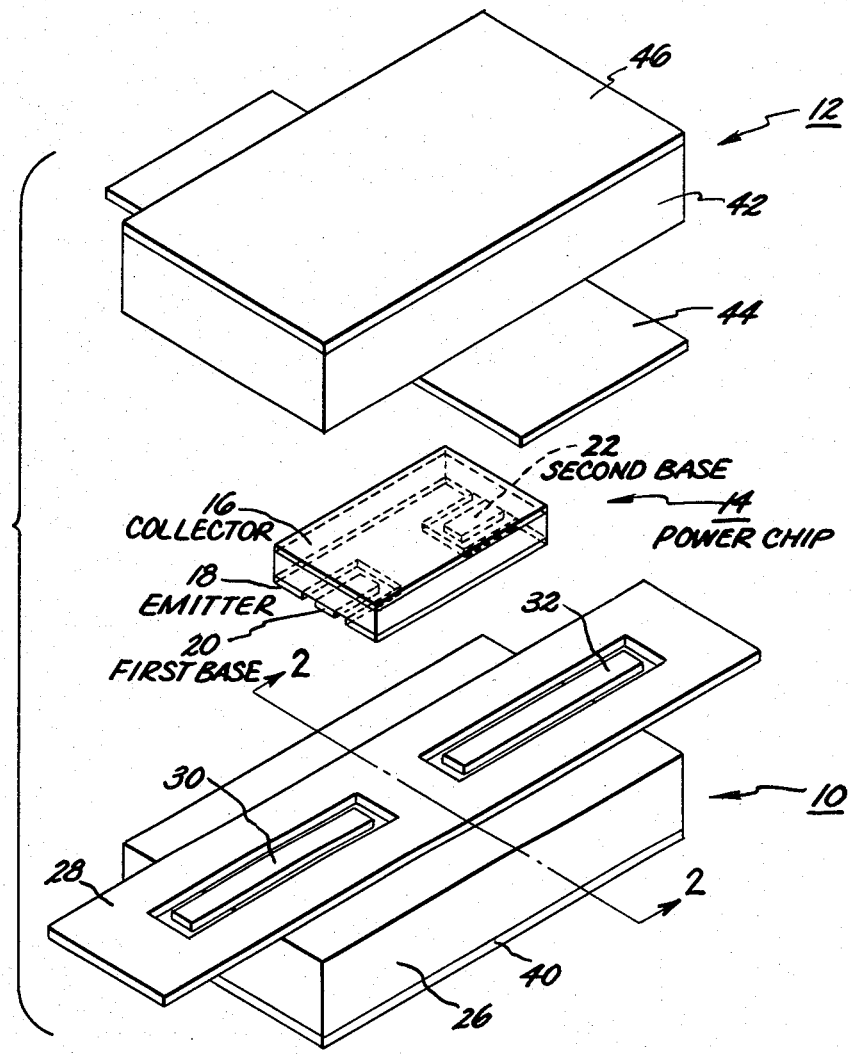
FIG. 1 is an exploded view of a power chip package in accordance with my invention, along with a power chip.

FIG. 1 illustrates in exploded fashion a power chip package comprising component sections 10 and 12, and an exemplary power chip 14, such as a power Darlington transistor. Power chip 14 comprises semiconductor material, such as silicon, in a wafer-like configuration and, as illustrated with exaggerated thickness, a collector terminal 16 on its upper side and an emitter terminal 18, a first base terminal 20 and a second base terminal 22 on its lower side. By comparison, a power diode would have only one terminal per side.

Power chip package section 10 comprises a dielectric substrate 26 and a plurality of sheet metal leads 28, 30, and 32 attached to the upper surface of the substrate. Dielectric substrate 26 preferably has a thermal conductivity of at least about 2.2 watts per centimeter-degrees centigrade, such as provided by the ceramic beryllia, a preferred material. Dielectric substrate 26 additionally should have a thermal expansion coefficient which is close to that of power chip 14 to minimize thermally-induced expansion and contraction stresses between the two. Where chip 14 comprises silicon, dielectric substrate 26 suitably comprises beryllia, which has a thermal expansion coefficient desirably close to that of silicon. Another suitable material for dielectric substrate 26 is the ceramic alumina.

Sheet metal leads 28, 30, and 32 preferably comprise copper with a thickness in the range of from about 3 mils (0.0076 cm) to 15 mils (0.038 cm), although they alternatively could comprise other, preferably high conductivity metals such as aluminum or silver. Sheet metal leads 28, 30, and 32 are patterned in mirror or reverse image fashion to the lower terminals 18, 20, and 22 of power chip 14 so that the terminals respectively abut sheet metal leads 28, 30, and 32 when power chip 14 is placed upon power chip carrier section 10.

I prefer to attach sheet metal leads 28, 30, and 32 to dielectric substrate 26 by means of a eutectic bonding technique; that is, a technique during which a molten eutectic alloy is formed between each of sheet metal leads 28, 30, and 32 and dielectric substrate 26. The molten eutectic alloy wets substrate 26, thereby assuring a strong bond to substrate 26. Details of suitable eutectic bonding techniques are known and are discussed (and claimed) for example, in the following U.S. Pat. No. 3,766,634—G. L. Babcock et al., issued Oct. 23, 1973 and U.S. Pat. No. 3,994,430—D. A. Cusano et al., issued Nov. 30, 1976. These patents are assigned to the assignee of this invention and their entire disclosures are incorporated herein by reference. As an alternative to using a eutectic bonding technique for attaching sheet metal leads 28, 30, and 32 to dielectric substrate 26, the upper surface of dielectric substrate 26 could be metallized with a solderable metal (not shown), such as by evaporation of copper onto such surface, and then sheet metal leads 28, 30, and 32 soldered to the solderable metal layer. This alternative requires that the solderable metal layer be patterned so as not to electrically short together the various sheet metal leads 28, 30, and 32. Such patterning is suitably accomplished using conventional photolithographic masking techniques while the solderable metal layer is being formed on the upper surface of dielectric substrate 26.

I prefer that the underside of dielectric substrate 26 be provided with a solderable metal layer 40, preferably comprising sheet metal such as copper adhered to substrate 26 in like manner as sheet metal leads 28, 30, and 32 are adhered to substrate 26. Solderable layer 40 could alternatively be formed by metallizing the lower surface of substrate 26, such as through evaporation of metal onto such surface. Solderable layer 40 can be omitted, however, such as where power power chip 14 generates only a small amount of heat, and replaced, for example, with epoxy adhesive containing metallic particles to impart a high thermal conductivity to the epoxy.

Power chip package section 12 comprises a dielectric substrate 42, a sheet metal lead 44 attached to the lower surface of substrate 42, and a solderable metal layer 46 attached to the upper surface of substrate 42. These parts 42, 44, and 46 correspond to dielectric substrate 26, sheet metal leads 28, 30, and 32, and solderable metal layer 40, respectively, of power chip package section 10 and are selected in accordance with the criteria therefor, discussed above.

Sheet metal lead 44 of power chip package section 12 is adapted to adjoin collector terminal 16 of power chip 14 when power chip package 10, 12 is assembled. Lead 44 does not need to be patterned, as is the case, for example, with lead 28, since collector 16 is the sole terminal of power chip 14 facing lead 44.

In mounting power chip 14 within power chip package 10, 12, it is preferable that the lower terminals 18, 20, and 22 of power chip 14 be solder bumped (i.e., provided with "bumps" of solder) so that they may be soldered to the respective sheet metal leads 28, 30, and 32 simply by placing power chip 14 on such leads and heating chip 14 and package section 10 to a sufficient temperature to complete a solder bond between the terminals and the leads. Collector terminal 16 is preferably solder coated and may be soldered to lead 44 of carrier section 12 before, during, or preferably, after the foregoing solder operation has been completed.

Figure 2:
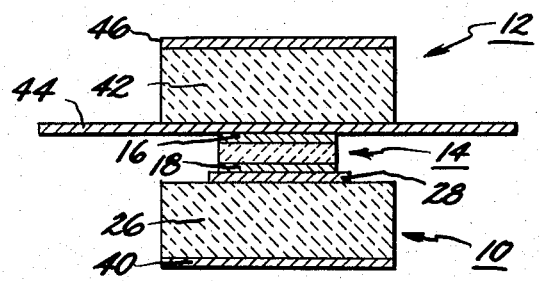
FIG. 2 is a cross-sectional view of the power chip package of FIG. 1 when assembled, taken along line 2—2 of FIG. 1.

FIG. 2 illustrates the cross section of a power chip package 10, 12 when assembled, with power chip 14 mounted therein, taken at line 2—2 in FIG. 1. Either or both solderable metal layers 40 and 46 of power chip package 10, 12 can be soldered to a single heat spreader plate or pair of plates (not shown), respectively. With either one of layers 40 or 46 soldered to a heat spreader plate, power chip 14 may be mounted collector 16 side up or collector 16 side down, as desired. Either or both of solderable metal layers 40 and 46 can be omitted if such layer or layers are not necessary for bonding to a heat spreader plate. For instance, both layers 40 and 46 can be omitted if package 10, 12 is otherwise bonded to a heat spreader plate, such as with an epoxy adhesive as described above.

In an alternative embodiment of my invention, power chip 14 is mounted solely upon power chip package section 10 and the upper side collector terminal 16 is tinned with solder. Then, for testing, in lieu of using power chip package section 12, a broad area electrical contact (not shown) is simply pressed against collector terminal 16 of power chip 14, the sole terminal on the upper surface of power chip 14, so that precise alignment with collector terminal 16 is unnecessary. In such embodiment dielectric substrate 26, selected for its high thermal conductivity, readily draws away heat from power chip 14 while chip 14 is undergoing electrical testing.

Considering again the FIG. 2 embodiment including power chip package section 12, as illustrated, power chip 14 can be tested at higher levels of heat generation than in the foregoing alternative embodiment, or in presently-available power chip packages. This is because whichever one of dielectric substrates 26 and 42 is not attached to a heat spreader plate absorbs heat from power chip 14, at least transiently, to the limit of its heat capacity.

Power chip package 10, 12 is considerably simpler in construction, and thus less costly, than currently-available power chip packages. This significantly reduces the expense of selecting power chips having similar characteristics inasmuch as power chips without desired characteristics and their packages are often discarded. Advantageously, the cruciform orientation of sheet metal leads 28 and 44 permits interconnection between the emitter and the collector of a pair of bipolar transistor power chips, each mounted in respective power chip carriers of my invention, with the remaining emitter and collector leads being spaced from each other for easy access to external circuitry (not shown). Sheet metal leads 28 and 44 additionally have the advantage of possessing only a low stray inductance, which reduces the possibility of undesirable voltage stresses arising therein when power chip 14 is rapidly switching large currents.

Turning to FIG. 3, a preferred power chip package 310, 312 of my invention is illustrated in exploded form, along with power chip 314. Power chip package 310, 312 is similar to power chip package 10, 12 of FIG. 1, with the exception that power chip package 310, 312 includes heat transfer means for transferring heat between dielectric substrates 326 and 342. This heat transfer means includes projections 326a and 326b of dielectric substrate 326, which extend upwardly from the main body of dielectric substrate 326 and preferably further include solderable metal layers 350a and 350b attached to the upper surfaces of projection 326a and 326b, respectively, such as by means of a eutectic bonding technique, or by soldering to an evaporated metal layer (not shown), such as copper. Solderable layers 350a and 350b are adapted to abut and be soldered to sheet metal lead 344 on the underside of dielectric substrate 342 when power chip package 310, 312 is assembled. The heat transfer means preferably also include projections 342a and 342b, which extend downwardly from the main body of dielectric substrate 342 so as to abut solderable metal layers 352a, 352b, 352c, and 352d which are preferably attached by means of a eutectic bond to the upper surfaces of the corners of dielectric substrate 326, respectively, when power chip package 310, 312 is assembled. The higher the thermal conductivity of projections 326a, 326b, 342a and 342b, the higher the heat removal capability of power chip package 310, 312. Therefore, it is preferable that these projections form a continuous ring around chip 314 when power chip package 310, 312 is assembled. Additionally, it is desirable that each of these projections have a large thickness, e.g., thickness T of projection 326b.

The advantages of including the foregoing heat transfer means between dielectric substrates 326 and 342 can be more fully appreciated by considering FIG. 4, which is a cross-sectional view of power chip package 310, 312, fully assembled, and power chip 314, taken at line 4—4 in FIG. 3. With heat from one of dielectric substrates 326 and 342 able to flow to the other substrate via heat transfer means 326a, 326b, 342a, and 342b, the heat removal capacity of power chip package 310, 312, for all significant levels of heat generation in power chip 314, is considerably enhanced over currently-available power chip packages. Advantageously, power chip package 310, 312 can be hermetically sealed with considerable facility, for example, by providing a heat deformable, adhesive dielectric layer, such as SILICA-SEAL ® 1161 sealing glass paste, on those portions of power chip package sections 310 and 312 which are to be joined together. Such a deformable adhesive layer advantageously could become cured at soldering temperatures, so as to hermetically bond together substrates 326 and 342, while power chip 314 is being soldered in place. Alternatively, a polymer sealant, such as an epoxy, polyimide, or silicone, could be used to bond the dielectric substrates together.

Referring now to FIG. 5, a power chip package 510, 512, along with a power chip 514, is illustrated in exploded form. Power chip package 510, 512 includes a heat transfer means of different construction than the heat transfer means of power chip package 310, 312 of FIG. 3. That is, the heat transfer means of power chip package 510, 512 comprises sheet metal layers 528a and 528b on dielectric substrate 526 and complementary layer 528a' and 528b' on dielectric substrate 542. Layers 528a and 528a' are suitably formed by successively folding respective layers of metal, such as copper, which are attached to substrates 526 and 542 as with eutectic alloy compositions. Layers 528a and 528a' are preferably soldered together during assembly of power chip carrier 510, 512. Layers 528b and 528b' are suitably symmetrical in structure and form to layers 528a and 528a'.

As best shown in FIG. 6, which illustrates a cross-section of power chip package 510, 512 when assembled and power chip 514, taken at line 6—6 in FIG. 5, the pairs of sheet metal layers 528a and 528a' and 528b and 528b' are tightly compacted together and each pair extends between the upper surface of dielectric substrate 526 and the lower surface of dielectric substrate 542 so as to provide high thermal conductivity paths between these substrates. Apart from the different configurations and orientations of sheet metal leads 528, 530, 532 and 544, power chip package 510, 512 is essentially similar to power chip package 10, 12 of FIG. 1.

In summary, the power chip package of my invention is considerably simpler in construction and thus lower in cost than currently-available power chip packages; therefore, it is much more amenable to the selection of power chips having similar characteristics. The embodiments of my power chip package having a pair of dielectric substrates with a power chip mounted therebetween have larger heat removal capacity than currently-available power chip packages. In the preferred embodiments of my invention in which a heat transfer means provides a path or paths of high thermal conductivity between a pair of dielectric substrates having a power chip mounted therebetween, the heat removal capacity at all significant levels of heat generation in the power chip is considerably higher than in presently available power chip packages.

While my invention has been described with respect to specific embodiments, many modifications and substitutions thereof will be apparent to those skilled in the art. It is, therefore, to be understood that the appended claims are intended to cover all such modifications and substitutions as fall within the true spirit and scope of the invention.

What I claim as my invention and desire to have secured by Letters Patent of the United States is:

1. A power chip package comprising:
a power chip having a first terminal on one side thereof and a second terminal on the opposite side thereof;
a first dielectric substrate;
a first sheet metal lead attached to one side of said first dielectric substrate and patterned in mirror image fashion to, and attached to, said first terminal;
a second dielectric substrate;
a second sheet metal lead attached to one side of said second dielectric substrate and patterned in mirror image fashion to, and attached to, said second terminal; and
a heat transfer means in heat flow communication with said first and second dielectric substrates for transferring heat between said first and second dielectric substrates, said heat transfer means comprising a plurality of compacted folds of sheet metal interposed between said first and second dielectric substrates.

2. The power chip package of claim 1 wherein said first and second dielectric substrates are each selected from the group consisting of alumina and beryllia.

3. The power chip package of claim 1 wherein said first and second dielectric substrates each comprise beryllia.

4. The power chip package of claim 1 wherein said first and second sheet metal leads each comprise copper.

5. The power chip package of claim 1 further comprising:
a first eutectic composition situated between and integrally bonding together said first sheet metal lead and said first dielectric substrate; and
a second eutectic composition situated between and integrally bonding together said second sheet metal lead and said second dielectric substrate.

6. The power chip package of claim 1 further comprising a solderable metal layer attached to a further side of said first dielectric substrate.

7. The power chip package of claim 1 further comprising a solderable metal layer attached to a further side of said second dielectric substrate.

8. The power chip package of claim 1 wherein said power chip has a third terminal, said third terminal being formed on said one side of said power chip, and further comprising a third sheet metal lead attached to said one side of said first dielectric substrate and patterned in mirror image fashion to, and attached to, said third terminal.

9. The power chip package of claim 8 wherein:
said first and second dielectric substrates are each selected from the group consisting of alumina and beryllia; and
said first, second and third sheet metal leads each comprises copper.

10. The power chip package of claim 9 further comprising:
a first eutectic composition situated between and integrally bonding together said first sheet metal lead and said first dielectric substrate;
a second eutectic composition situated between and integrally bonding together said second sheet metal lead and said second dielectric substrate; and
a third eutectic composition situated between and integrally bonding together said third sheet metal lead and said first dielectric substrate.

11. The power chip package of claim 1 wherein said compacted folds of sheet metal interposed between said first and second dielectric substrates comprise leads of the power chip package.

12. A package for a power chip comprising:
a first dielectric substrate;
a plurality of sheet metal leads attached to one side of said first dielectric substrate and patterned in mirror image fashion to the terminal pattern on one side of a power chip;
a second dielectric substrate;
a further sheet metal lead attached to one side of said second dielectric substrate and patterned in mirror image fashion to a terminal on another side of the power chip; and
heat transfer means for transferring heat between said first and second dielectric substrates, said heat transfer means comprising a plurality of compacted folds of sheet metal interposed between said first and second dielectric substrates.

13. The power chip package of claim 11 further comprising:
a plurality of eutectic compositions respectively situated between and integrally bonding together each of said plurality of sheet metal leads and said first dielectric substrate; and
a further eutectic composition situated between an integrally bonding together said further sheet metal lead and said second dielectric substrate.

14. The power chip package of claim 13 wherein said first and second dielectric substrates each comprise one of the group consisting of alumina and beryllia.

15. The power chip package of claim 12 wherein said compacted folds of sheet metal interposed between said first and second dielectric substrates comprise leads of the power chip package.

* * * * *